(12) United States Patent
Chow

(10) Patent No.: US 6,232,226 B1
(45) Date of Patent: May 15, 2001

(54) METHOD OF FABRICATING BARRIER LAYER IN INTEGRATED CIRCUIT

(75) Inventor: Yu-Chang Chow, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/227,626

(22) Filed: Jan. 8, 1999

(30) Foreign Application Priority Data

Oct. 15, 1998 (TW) ................................................ 87117115

(51) Int. Cl.$^7$ ................................................ H01L 21/44
(52) U.S. Cl. .................. 438/652; 438/653; 438/654; 438/656; 438/660; 438/663; 438/675
(58) Field of Search .................. 438/598, 584, 438/630, 648, 663, 672, 682, 683, 654, 653, 656, 675, 685

(56) References Cited

U.S. PATENT DOCUMENTS 5,998,870 * 12/1999 Lee et al. .............................. 257/751
5,998,871 * 12/1999 Urabe .................................. 257/754
6,110,789 * 8/2000 Rhodes et al. ...................... 438/305

* cited by examiner

*Primary Examiner*—Matthew Smith
*Assistant Examiner*—Craig P. Lytle
(74) *Attorney, Agent, or Firm*—Jiawei Huang; J.C. Patents

(57) ABSTRACT

A method of fabricating a barrier layer includes a clamped metal layer formed on a substrate. After the formation of the clamped metal layer, a rapid thermal process is performed. A clampless metal nitride layer is then formed on the clamped metal layer.

10 Claims, 4 Drawing Sheets

METHOD OF FABRICATING BARRIER LAYER IN INTEGRATED CIRCUIT

CROSS-REFERENCE TO RELATED APPLICATION

This application claims priority benefit of Taiwan application Serial No. 87117115, filed Oct. 15, 1998, the full disclosure of which is incorporated herein by reference.

BACKGROUND OF THE INVENTION

1. Field of the Invention

The invention relates to a method of fabricating an integrated circuit, and more particularly to a method of fabricating a barrier layer in the integrated circuit.

2. Description of the Related Art

Metal materials such as aluminum and tungsten are often used in the metallization process of current integrated circuits. Aluminum is selected as a wiring line between devices due to its low resistivity. Tungsten has a higher resistivity than aluminum, but it can be formed by chemical vapor deposition with better step coverage and tungsten easily forms fluoride with high volatility, so that there is no problem with removing tungsten by etching. Therefore, tungsten is widely used in fabrication of metal plugs. However, adhesion between tungsten and other materials, such as silicon, is not very good. A barrier/glue layer is necessary between tungsten and other material to enhance the adhesion thereof.

Titaniunem nitride is frequently used for a barrier/glue layer in very large scale integrated (VLSI) process. The titanium nitride is formed by physical vapor deposition, such as, sputtering. The titanium nitride has high contact resistance with the silicon layer and since the titanium easily reacts with the silicon to form titanium silicide with low resistivity, a titanium layer is therefore formed between the titanium nitride and the silicon to create a good ohmic contact therebetween.

FIG. 1A–1B are schematic, cross-sectional views illustrating fabrication of a barrier layer according to prior art. Referring to FIG. 1A, a substrate 100 having devices (not shown) fabricated thereon is provided and a dielectric layer 126 with a contact window 130 is formed on the substrate 100. A clamp 106 clamps the fringe of the substrate 100 with a length L of about 3 mm. A metal titanium layer 102, which is a clamped titanium layer, is formed on the dielectric layer 126 and the contact window 130.

Referring to FIG. 1B, the clamp 106 is removed, and therefore a distance L between the edge of the clamped titanium layer 102 and the fringe of the substrate 100 is about 3 mm. A titanium nitride layer 104 is formed over the substrate 100. Since there is no clamp to clamp the substrate 100 while forming the titanium nitride layer 104, the formation of the titanium nitride layer 104 is a clampless titanium nitride layer (101 TiN) hereinafter, the formation of TiN is referred as a 101 TiN process. A rapid thermal process (RTP) is carried out and a portion of the clamped titanium layer 102 reacts with the substrate 100 to form titanium silicide 132 with low resistance. A barrier layer including a clamped titanium layer 102 and a clampless titanium nitride layer 104 is completed.

Referring to FIG. 1C, since the thermal expansion coefficient of the clamped titanium layer 102 is different from that of the clampless titanium nitride layer 104 which covers the edge of the clamped titanium layer 102, some microcracks 120 are produced within the clampless titanium nitride layer 104 when the RTP is performed. The microcracks expand to the center of the wafer to expose the clamped titanium layer 102 and form cracks 120a. Moisture thus enters into the wafer with devices through the cracks 120, 120a. Source gas $WF_6$ diffuses into the microcracks 120, 120a and reacts with clamped titanium layer 102 to form solid $TiF_x$ during the fabrication of the tungsten plug 128. The solid $TiF_x$ even fills the microcracks to cause abnormal conduction, leakage or shorts of device.

SUMMARY OF THE INVENTION

It is therefore an object of the invention to provide a method of fabricating a barrier layer of integrated circuit. The abnormal conduction, leakage or shorts of devices due to microcracks within the titanium nitride layer can be resolved.

To achieve these objects and advantages, and in accordance with the purpose of the invention, as embodied and broadly described herein, the invention is directed towards a method of fabricating a barrier layer of integrated circuit. A clamped metal layer is formed on a substrate. A RTP is performed and a clampless titanium nitride layer is formed on the clamped metal layer.

To achieve one of the objects as described, a method of fabricating a barrier layer of the integrated circuit is provided. A substrate having a clamped metal layer is provided. A clampless titanium nitride layer is then fabricated when the atmosphere temperature is adjusted and a RTP is carried out.

To achieve another of the objects as described, a method of fabricating a barrier layer of the integrated circuit is provided. A clampless metal layer and a clampless metal nitride layer are successively formed on the substrate and a RTP is then performed.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIRST EMBODIMENT

Figure 2A:
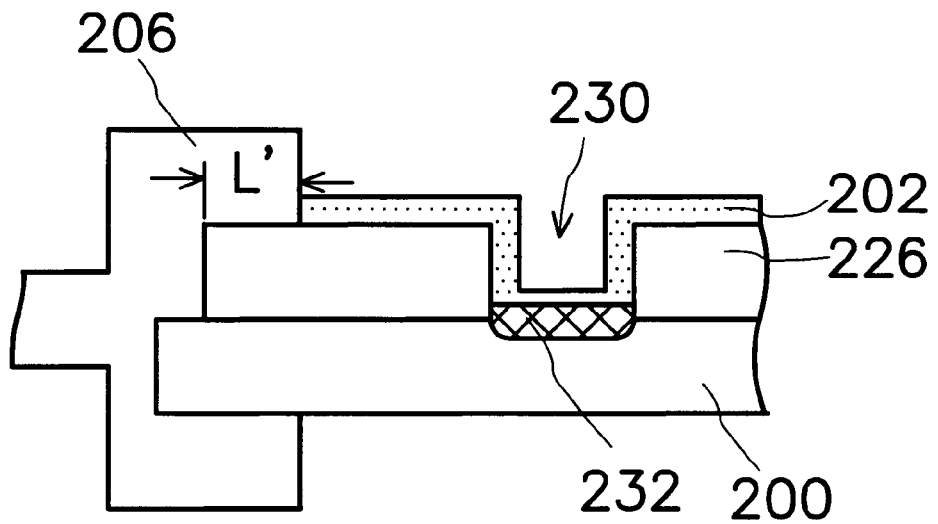
FIG. 2A–2B are schematic, cross-sectional view illustrating fabrication of a barrier layer in a preferred embodiment according to the invention.

Referring to FIG. 2A, a substrate 200 having devices (not shown) formed thereon is provided. A dielectric layer 226 is formed over the substrate 200, and a contact window 230 is formed within the dielectric layer 226 by patterning. The fringe of the dielectric layer 226 and the substrate 200 with a length L' of about 3 mm is clamped by a clamp 206. A clamped metal layer 202 such as titanium is then formed on the dielectric layer 226 and the contact window 230, not occupied by the clamp 206 and with the clamp 260 being removed after the formation of the clamped metal layer 202. The clamped metal layer 202 is preferably formed by physical vapor deposition (PVD) such as DC sputtering and with a thickness of about 200–500 Å. A RTP is carried out with interruption of the in-situ process, which is one feature of this invention. The clamped metal layer 202 reacts with the silicon of the substrate 200 to form a silicide layer, such as titanium silicide 232 with low resistance between the clamped metal layer 202 and the substrate 200, and tensile stress in the clamped metal layer 202 can be released. Therefore, microcracks due to different thermal expansion coefficient does not occur within layers in subsequent process.

Figure 2B:
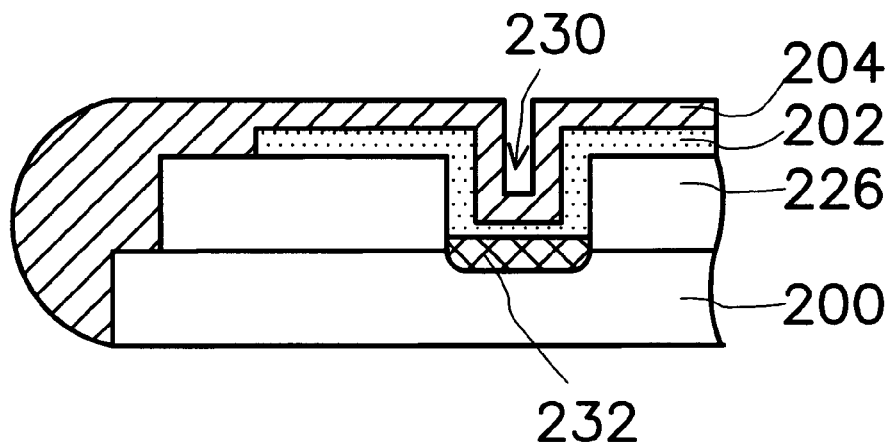

Referring to FIG. 2B, a clampless metal nitride layer 204 which is the metal nitride layer formed after the removal of the clamp 206, is formed to serve as a barrier layer and completely cover the clamped metal layer 202 and the whole fringe of the dielectric layer 226 and the substrate 200. The clampless metal nitride layer 204, made of a material such as titanium nitride is preferably formed by PVD such as sputtering. Ar and $N_2$ are gas sources and titanium is used as a target material. The pressure inside the reaction chamber is about several mtorr to 100 mtorr, and the barrier layer 204 with a thickness of about 500–500 Å is formed.

The first embodiment uses RTP to prevent stress from occurring between the clamped titanium layer 202 and the clampless metal nitride layer 204; therefore, microcracks are not produced.

Figure 1A:
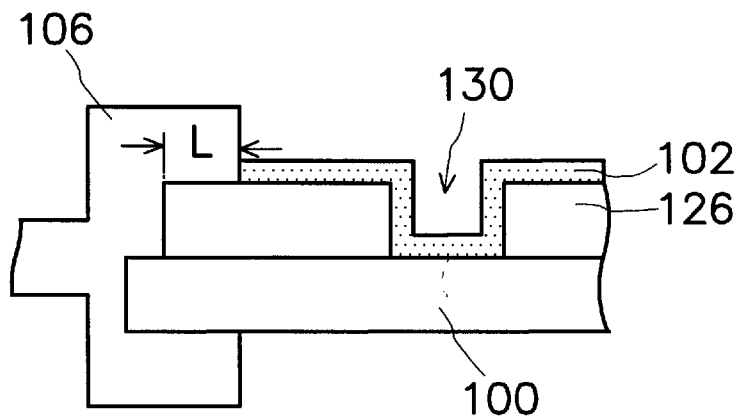
FIG. 1A–1B are schematic, cross-sectional views illustrating fabrication of a barrier layer known in prior art.
Figure 1B:
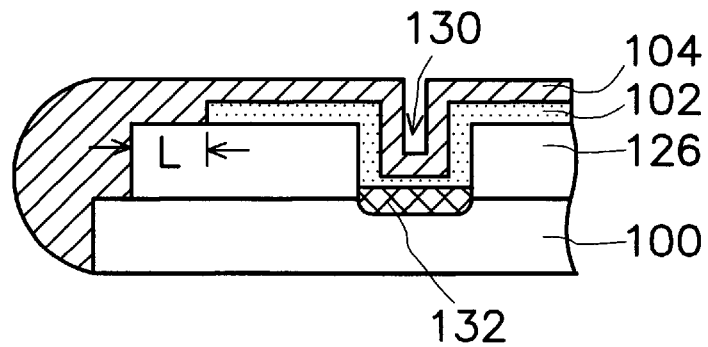
Figure 1C:
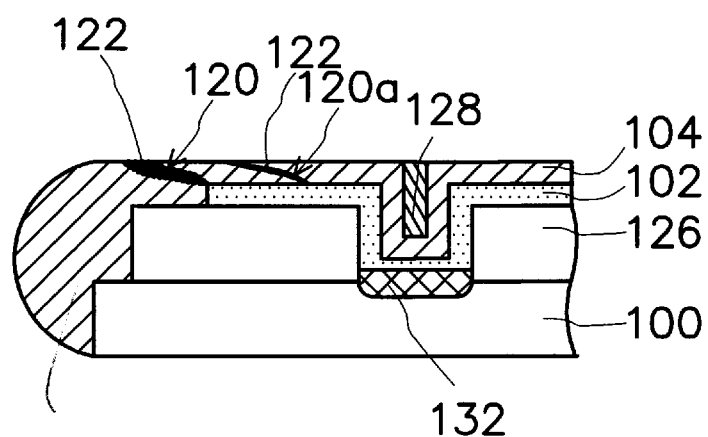
FIG. 1C is a schematic, cross-sectional view of the conventional tungsten plug according to prior art.

As a result, the clampless titanium layer is not exposed. While forming a tungsten plug to fill the contact window 230 (similar to the tungsten plug 128 in FIG. 1C), a source, for example, $WF_6$ is not to react with the clamped titanium layer 202 to prevent the formation of $TiF_x$.

SECOND EMBODIMENT

Figure 3A:
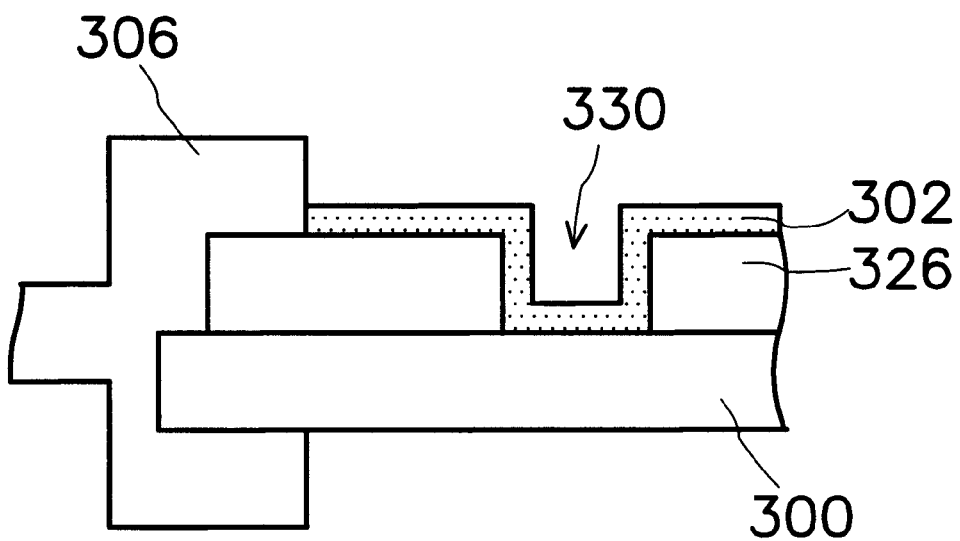
FIG. 3A–3B are schematic, cross-sectional views illustrating fabrication of a barrier layer in a preferred embodiment according to the invention.

Referring to FIG. 3A, a substrate 300 similar to that in FIG. 2A is provided and a clamped metal layer 302, as defined above, is formed thereon. The formation of the clamped metal layer 302 is carried out as described above. That is, a dielectric layer 326 is formed with a contact window 330 therein on the substrate 300. The fringes of the dielectric layer 326 and the substrate 300 are clamped by a clamp 306.

Figure 3B:
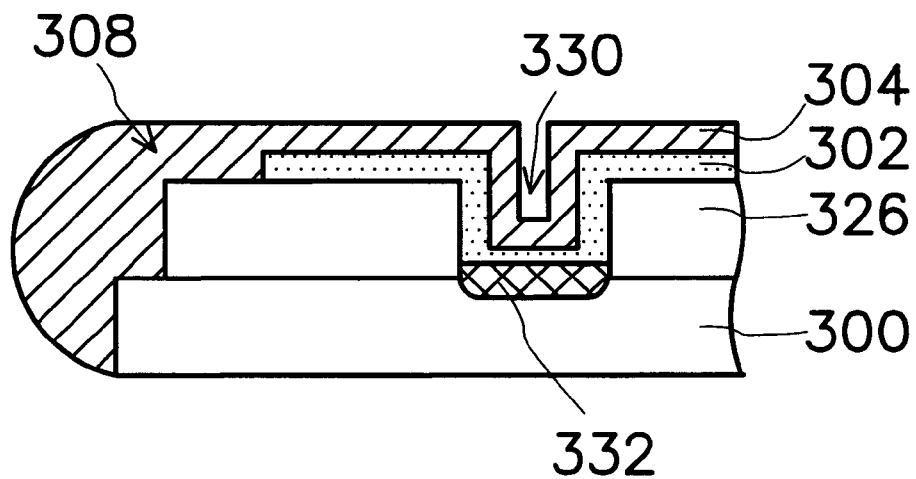

Referring to FIG. 3B, a 101 TiN process is performed to form a clampless metal nitride layer 304, as defined above, that serves as a barrier layer on the substrate 300 and completely covers the clamped titanium layer 302 and the whole fringe of the dielectric layer 326 and the substrate 300. The method, the conditions and the thickness necessary to form the metal nitride layer 304 are the same as those of the barrier layer 204 in FIG. 2B. A RTP is performed to form a silicide layer 332 such as titanium silicide between the substrate 300 and the clamped titanium layer 302. In order to prevent microcracks from occurring within the clampless metal nitride layer 304 due to different thermal expansion coefficients of the clamped metal layer 302 and the clampless metal nitride layer 304; the process temperature is adjusted while forming the clamped metal layer 302 or the clampless metal nitride layer 304. The stress between the clamped titanium layer 302 and the clampless metal nitride layer 304 become small.

The way to adjust the process temperature includes in-situ preheating the substrate 300 to a temperature of above 400° C. and then placing the substrate 300 in a chamber at a temperature of about 100° C. to perform the 101 TiN process. Alternatively, the 101 TiN process can be directly performed in the chamber at a of about 400° C. to form the clampless metal nitride layer 304 on the substrate 300.

The stress between clamped titanium layer 302 and the clampless metal titanium layer 304 becomes small and the microcracks within the clampless metal nitride layer 304 are not produced while forming the titanium silicide layer 332 in RTP.

THIRD EMBODIMENT

Figure 4:
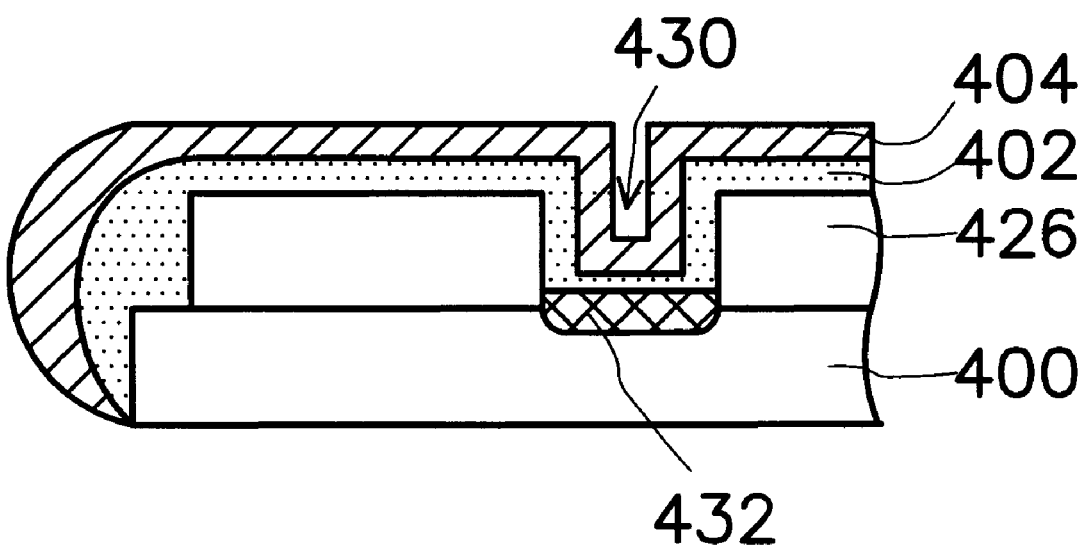
FIG. 4 is schematic, cross-sectional view of a barrier layer in a preferred embodiment according to the invention

Referring to FIG. 4, a substrate 400 similar to that in FIG. 2A is provided. A clampless metal layer 402, formed without the use of a clamp, is formed over the substrate 400 and a 101 TiN process forms a clampless metal nitride layer 404, as defined above, on the substrate 400 to completely cover the fringe of the dielectric layer 426 having a contact window 430 therein and the substrate 400. The conditions to form the clampless meetal layer 402, preterably, a clampless titanium layer and the clampless metal nitride layer 404 are similar with those described in association with FIG. 2A. A RTP is then performed to form a silicide layer 432 such as titanium silicide between the substrate 400 and the clamped metal layer 402.

Since the clampless metal layer 402 and the clampless metal nitride layer 404 cover the fringe of the dielectric layer 426 and the substrate 400, microcracks do not occur within the clampless metal nitride layer 404.

As described above, the features of this invention are as follows:

1. The RTP to form the metal silicide layer is performed prior to the 101 TiN with interrupting the in-situ process, such that the stress in the clamped metal layer can thus be released and the microcracks are not produced in the clampless metal nitride layer.

2. The temperature to form the clamped metal layer or the clampless metal nitride layer is adjusted without interrupting in-situ process, so that the stress between these layers can be released to prevent microcracks occurring during RTP.

3. The clampless metal layer and the clampless metal nitride layer are formed in-situ to cover whole fringe of the substrate and therefore the microcracks are not produced while the RTP is performed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for fabricating a barrier layer, comprising:
   forming a clamped metal layer over a substrate in the presence of a clamp on the substrate;
   preheating the clamped metal layer to a first temperature;
   forming a clampless metal nitride layer at a second temperature on the metal layer after preheating the clamped metal layer; and
   performing a rapid thermal process on the substrate comprising the clamped metal layer and the clampless metal nitride layer; wherein the first temperature and the second temperature are adjusted so that microcracks occurring in the metal layer are prevented.

2. The method according to claim 1, wherein the first temperature is about 400° C.

3. The method according to claim 1, wherein the clampless metal nitride layer is formed at a temperature of about 100° C.

4. A method for fabricating a barrier layer, comprising:

forming a clamped metal layer over a substrate in the presence of a clamp on the substrate;

forming a clampless metal nitride layer at a temperature; and performing a rapid thermal process on the substrate comprising the clamped metal layer and the clampless metal nitride layer; wherein the temperature, at which said clampless metal nitride layer is formed, is adjusted so that the clampless metal nitride layer has a thermal expansion coefficient the same as the clamped metal layer.

5. The method according to claim 4, wherein the temperature, at which said clampless metal nitride layer is formed, is about 400 degree Celsius.

6. A method of fabricating a barrier layer, comprising:

forming a clampless metal layer over a substrate, the clampless metal layer covering the substrate including a fringe of the substrate;

forming a clampless metal nitride on the clampless metal layer; the clampless metal nitride layer also covering the fringe of the substrate; and performing a rapid thermal process on the substrate.

7. A method of forming a barrier layer, comprising:

providing a substrate on which a dielectric layer having a contact window to expose a portion of the substrate is formed and clamped by a clamp formed at a fringe of the substrate;

forming a clamped metal layer on a surface of the dielectric layer and the contact window;

forming a clampless metal nitride layer on the clamped metal layer; and performing a rapid thermal process on the substrate; wherein either the clamped metal layer is preheated to a first temperature prior to the formation of the clampless metal nitride layer, or the clampless metal nitride layer is formed at a second temperature, so that microcracks are prevented from occurring due to different thermal expansion coefficient during the step of rapid thermal process.

8. The method according to claim 7, wherein the first temperature is about 100 degree Celsius, and the second temperature is about 400 degree Celsius.

9. The method according to claim 7, comprising further a step of forming a tungsten plug to fill the contact window after forming the clampless metal nitride layer.

10. The method according to claim 9, wherein the tungsten plug is formed using a source $WF_6$ that is not penetrate through the clampless metal nitride layer to react with the clamped metal layer.

* * * * *